United States Patent
Figueroa et al.

(10) Patent No.: US 7,205,638 B2
(45) Date of Patent: Apr. 17, 2007

(54) SILICON BUILDING BLOCKS IN INTEGRATED CIRCUIT PACKAGING

(75) Inventors: David Gregory Figueroa, Mesa, AZ (US); Dong Zhong, San Jose, CA (US); Yuan-Liang Li, Chandler, AZ (US); Jiangqi He, Gilbert, AZ (US); Cengiz Ahmet Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/931,497

(22) Filed: Aug. 31, 2004

(65) Prior Publication Data

US 2005/0029555 A1 Feb. 10, 2005

Related U.S. Application Data

(62) Division of application No. 10/329,190, filed on Dec. 23, 2002, now Pat. No. 6,815,256.

(51) Int. Cl.
*H01L 29/40* (2006.01)

(52) U.S. Cl. ............. 257/621; 257/690; 257/698; 257/E23.011

(58) Field of Classification Search ............... 257/621
See application file for complete search history.

(56) References Cited

U.S. PATENT DOCUMENTS

| 3,646,666 A | | 3/1972 | Boleky et al. | |
|---|---|---|---|---|
| 4,534,100 A | * | 8/1985 | Lane | 438/468 |
| 4,969,022 A | | 11/1990 | Nishimoto et al. | |
| 5,084,403 A | | 1/1992 | Matsuoka | |
| 6,221,769 B1 | * | 4/2001 | Dhong et al. | 438/667 |
| 6,268,238 B1 | * | 7/2001 | Davidson et al. | 438/107 |
| 6,603,915 B2 | * | 8/2003 | Glebov et al. | 385/129 |
| 6,608,250 B2 | | 8/2003 | Ghoshal | |
| 6,674,138 B1 | * | 1/2004 | Halliyal et al. | 257/411 |
| 2002/0022362 A1 | * | 2/2002 | Ahn et al. | 438/667 |
| 2002/0155386 A1 | * | 10/2002 | Xu et al. | 430/312 |
| 2003/0003665 A1 | * | 1/2003 | Nakagawa | 438/275 |
| 2003/0057517 A1 | * | 3/2003 | Goldberger et al. | 257/532 |
| 2003/0104688 A1 | * | 6/2003 | Wade | 438/622 |
| 2004/0108587 A1 | * | 6/2004 | Chudzik et al. | 257/700 |

* cited by examiner

*Primary Examiner*—Tu-Tu Ho
(74) *Attorney, Agent, or Firm*—Marger Johnson & McCollom, P.C.

(57) ABSTRACT

An improved silicon building block is disclosed. In an embodiment, the silicon building block has at least two vias through it. The silicon building block is doped and the vias filled with a first material, and, optionally, selected ones of the vias filled instead with a second material. In an alternative embodiment, regions of the silicon building block have metal deposited on them.

15 Claims, 2 Drawing Sheets

Figure 1
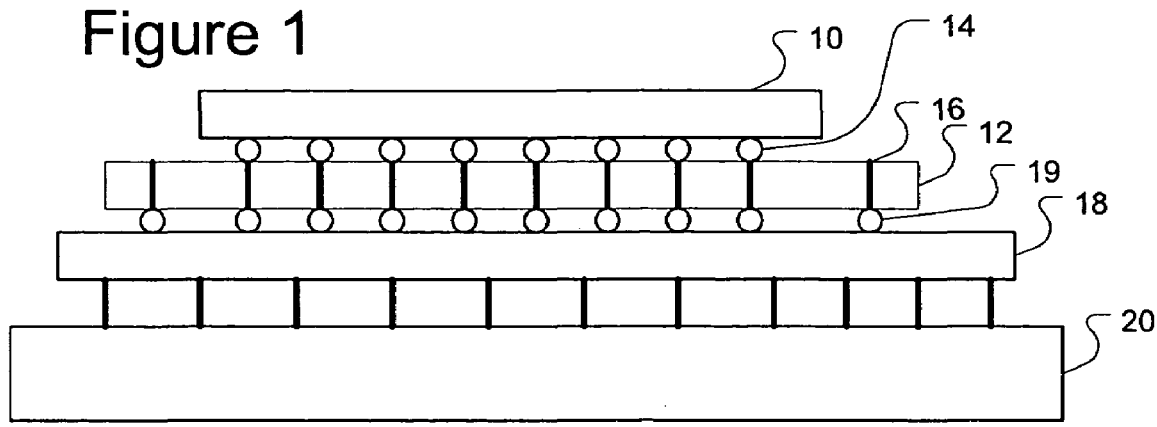
Figure 2
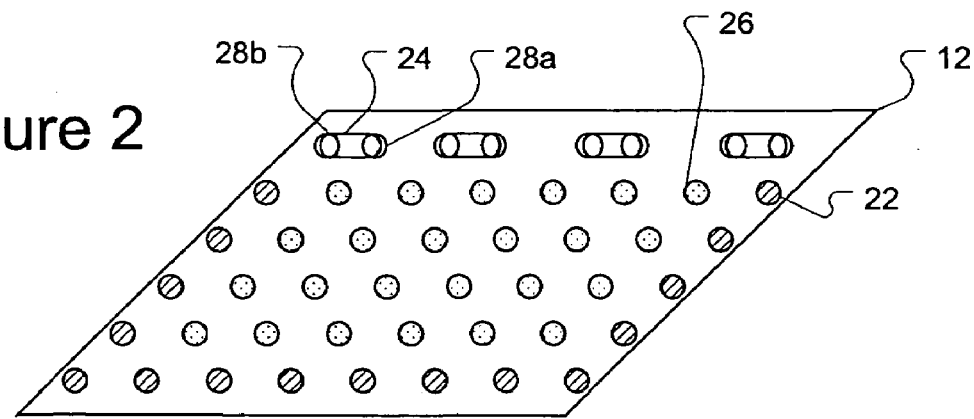
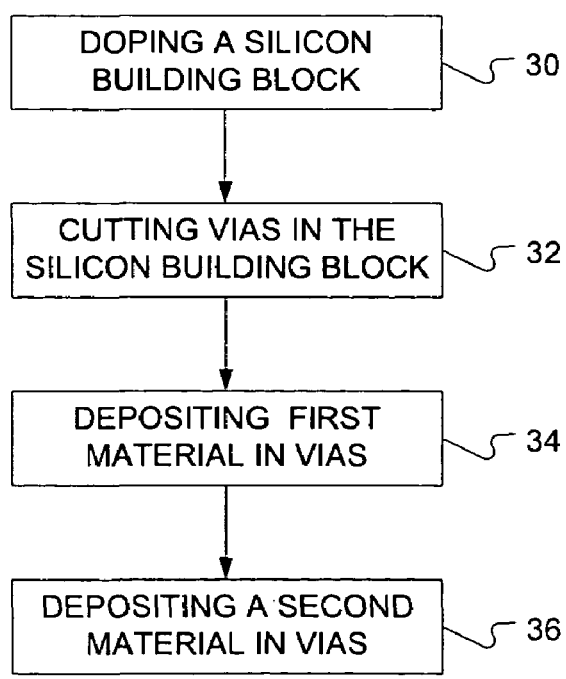
Figure 3

SILICON BUILDING BLOCKS IN INTEGRATED CIRCUIT PACKAGING

This application is a divisional of prior application Ser. No. 10/329,190 filed Dec. 23, 2002 now U.S. Pat. No. 6,815,256.

BACKGROUND

As the speed and density of semiconductor integrated circuits increase, thermal and electrical connectivity issues have raised the requirements for packaging. Many integrated circuits are packaged using organic materials, materials and their processes not necessarily compatible with the expertise and capability of the semiconductor integrated circuit manufacturers. Some manufactures have taking to using a block of silicon between the integrated circuit die and the printed circuit board upon which it is to be mounted.

Generally, the integrated circuit die is mounted on the silicon building block, which in turn may be mounted on a plastic, or other material, substrate or package. This entire apparatus is then mounted on the printed circuit board. Mounting to the printed circuit board generally involves a ball grid array or pin grid array to complete the electrical connections between the integrated circuit and the printed circuit board.

The addition of silicon building blocks has loosened some of the manufacturing requirements of the package, reducing costs and making the packaging process less prohibitive to semiconductor manufacturers. However, the addition of the silicon building block has led to some problems such as large insertion loss, high return loss, cross talk and a high impedance path for power delivery. The silicon building block has high dielectric loss, resulting in large insertion loss. The return loss results from the impedance mismatch between the silicon building block and the die. Cross talk problems arise because of the higher order mode that propagates through the silicon building block. The small vias used for Vcc and Vss result in a high impedance path for power delivery.

BRIEF DESCRIPTION OF THE DRAWINGS

Embodiments of the invention may be best understood by reading the disclosure with reference to the drawings, wherein:

FIG. 1 shows a cross sectional view an embodiment of an integrated circuit package with a silicon building block.

FIG. 2 shows a top view of an embodiment of a doped silicon building block.

FIG. 3 shows a flowchart of an embodiment of a method of manufacturing a doped silicon building block.

DETAILED DESCRIPTION OF THE EMBODIMENTS

Figure 4:
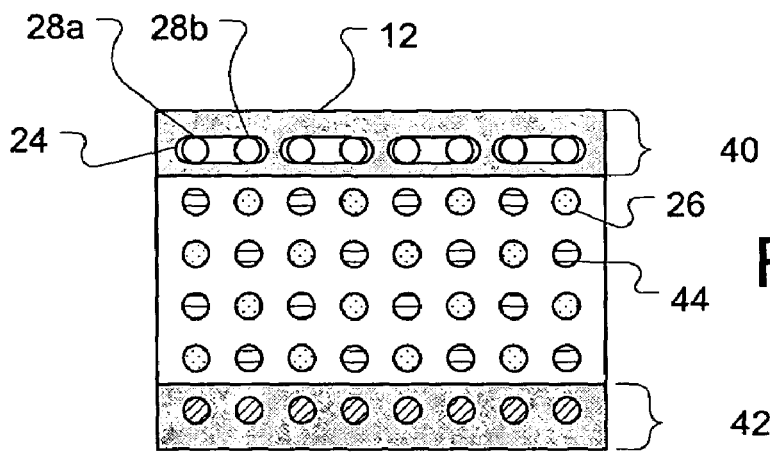
FIG. 4 shows a top view of an embodiment of a silicon building block having at least one metal region.

FIG. 1 shows a cross sectional view of an example of an integrated circuit being packaged using a silicon building block. An integrated circuit die 10 contains the operational components of an integrated circuit, such as a microprocessor, controller or other integrated circuit. It is to be mounted onto the printed circuit board 20, in which there are electrical connection paths, or traces, with which the operational components of the integrated circuit 10 must become electrically coupled.

In between the die 10 and the printed circuit board 20 are a silicon building block 12 and a plastic, or other material, interposer substrate 18.

The electrical connection paths are maintained through the silicon building block by the solder balls 14 between the integrated circuit 10 and the silicon building block 12, and the solder balls 19 between the silicon building block and the interposer substrate. In the silicon building block, vias such as 16, filled with the appropriate material allow the connections between the integrated circuit and the printed circuit board to be completed.

In previous implementations of the silicon building block, there is large insertion loss due to the high dielectric loss, high return loss due to the impedance mismatch created by the building block, large amounts of cross talk generated by the higher order mode propagating through the building block and a high impedance path for power delivery due to small sizes of the Vcc and Vss vias.

In the embodiment of the silicon building block of FIG. 1, the silicon building block is doped to avoid these problems. This particular implementation has the silicon building block N-doped, that is, doped with a material such as antimony, arsenic and phosphorous. Essentially, this causes the silicon building block 12 to act as a ground plane, providing a common reference for all of the signals that pass through the vias.

FIG. 2 shows a top view of an embodiment of a silicon building block having vias. The silicon building block itself is heavily N-doped, causing it to act as a ground plane. Vias such as 22 have a first material deposited inside them that is for single-ended signals. Single-ended signals, as that term is used here, as signals that have one-bit per wire, such as digital data signals. Via 24 actually has two smaller vias within it, for differential signals. Differential signals typically have a plus and a minus component, each of which signal has its own 'wire,' or in this case, via. Differential signals may be better understood as signals of one-bit of data having two wires.

Both single-ended and differential signals benefit from having a common reference signal. Differential signals require that the plus and minus components have a common reference, although the reality is that there is often a variation between the reference for the positive component and the reference for the negative component. This can cause problems for the differential signals, as it is the difference of each component from the common reference that determines the state of the bit. Using the heavily doped silicon building block as the common reference alleviates this problem.

Similarly, the use of the silicon building block as the ground plane eliminates the high impedance problems previously experienced in power delivery through the previous implementation of the silicon building block. Having the ground plane essentially between the wires, in this case the filled vias act as wires, also prevents cross talk and reduces the insertion and return loss. In one embodiment, the different vias for the different types of paths needed through the vias have different materials.

For example, as can be seen by the vias with the diagonal stripes, such as 22, the vias for the single-ended signals has a first type of material deposited in them. The vias 28a and 28b for the differential signals may be of the same material or of a different material. For example, it may be advantageous to use a low-loss material with a low average dielectric constant (K). A low-K material, as that term is used here, would have a K value in the range of 1.3 to 2.5, inclusive. For the power vias such as 26, using a high-K material may be advantageous as well, where a high K material would have an average dielectric constant of 100 or more, even as high as greater than 1000.

An embodiment of a method of manufacturing a doped silicon building block is shown in FIG. 3. The silicon building block is doped at 30. Vias are then cut into the block at 32, more than likely by standard semiconductor processing techniques such as masking, patterning and etching the vias. At 34 a first material is deposited in selected ones of the vias, such as the low-K, low-loss material mentioned above. At 36, a second material is depositing in selected ones of the vias. However, it should be noted that the use of a second material is optional. For cost reduction and manufacturing simplicity, the same material could be used for both the power paths and the signal paths, although that material would more than likely not be a low-loss, low-K material.

An alternative embodiment of an improved silicon building block is shown in FIG. 4. In this embodiment, the silicon building block 12 has at least one region upon which is deposited metal. In the particular embodiment of FIG. 4, there are two regions of metal, 40 and 42. The first region of metal 40 is in the region where the vias 24 for the differential signal vias 28a and 28b reside. The second region of metal 42 is in the region where the vias for the single-ended signals 22 reside. As the silicon building block does not act as a ground plane in this embodiment, there are two different types of vias for power delivery, the horizontally lined vias such as 44 for Vss and the dotted vias for Vcc.

In this manner a coaxial transmission line structure is created. The metal provides signal reference for the high-speed differential signals and the single-ended signals, while separating the signaling vias from the power vias. This will alleviate the signaling problems caused by insertion loss, return loss and crosstalk, while allowing better impedance control of the power delivery.

Figure 5:
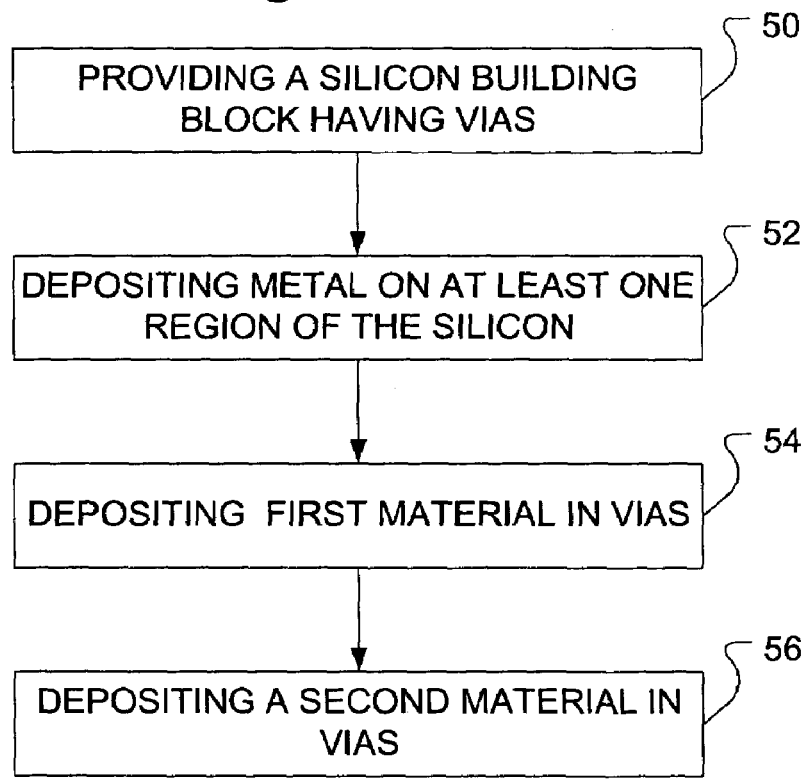
FIG. 5 shows a flowchart of an embodiment of a method of manufacturing a silicon building block with a metal region.

FIG. 5 shows an embodiment of a method of manufacturing a silicon building block with at least one metal region. At 50, a silicon building block having vias is provided. It is probably more efficient and cost-effective to etch the vias prior to depositing the metal, as it is easier to etch silicon than metal. The metal is deposited on the silicon building block at 52. A first material is deposited in the vias at 54. A second material is deposited in the vias at 54.

As mentioned above, the use of a second material is optional. However, using the low-K, low-loss material discussed above for the signaling vias and a high-K material for the power vias has several advantages. If one material is used for the vias, it is more than likely not going to be either a low-K or a high-K material, but something suitable for both power delivery and signaling paths. If two materials are used, the first material would be deposited in first selected ones of the vias, and the second in second selected ones. With only one material, the first selected ones would constitute all of the vias.

In either of these alternative embodiments as well as all the variations and combinations thereof, a silicon building block is adapted to provide improved signal and power characteristics for the integrated circuit package. Use of the improved silicon building block alleviates problems with cross talk, insertion and return losses and impedance control for power delivery. The improvements to the silicon building block are semiconductor-compatible processes that leverage the expertise of the semiconductor manufacturers.

Thus, although there has been described to this point a particular embodiment for a method and apparatus for packages with improved silicon building blocks, it is not intended that such specific references be considered as limitations upon the scope of this invention except in-so-far as set forth in the following claims.

What is claimed is:

1. A silicon building block, comprising:
   a piece of silicon having a first surface to electrically connect to an integrated circuit and a second surface opposite the first surface to electrically connect to a printed circuit board, wherein the piece of silicon is doped to a single polarity;
   a first set of vias disposed in the piece of doped silicon and through the piece of doped silicon between the first surface and the second surface, the first set of vias comprising at least one via;
   a second set of vias disposed in the piece of doped silicon and through the piece of doped silicon between the first surface and the second surface, the second set of vias comprising at least one via;
   a first material in the first set of vias, wherein the first material has an average dielectric constant greater than or equal to 100; and
   a second material in the second set of vias, wherein the first material is not included in the second set of vias.

2. The silicon building block of claim 1 the piece of doped silicon further comprising a piece of N-doped silicon.

3. The silicon building block of claim 1 the first set of vias and the second set of vias comprising at least one via for power delivery and at least one via for signal delivery.

4. The silicon building block of claim 1 the second material comprising a low loss material with an average dielectric constant in the range of 1.3 to 2.5, inclusive.

5. An apparatus, comprising:
   a silicon building block doped with a single dopant having a plurality of vias, wherein a first material having an average dielectric constant greater than or equal to 100 is in first selected ones of the plurality of vias; and
   an integrated circuit on a die in contact with the silicon building block, wherein power and signal paths utilized by the integrated circuit pass through the plurality of vias to a printed circuit board, and wherein the signal paths comprise single-ended signal paths for single-ended signals and differential signal paths for differential signals.

6. The apparatus of claim 5 the silicon building block further comprising a ground plane.

7. The apparatus of claim 5 the silicon building block further comprising an N-doped silicon building block.

8. The apparatus of claim 5 the silicon building block comprising a second material in second selected ones of the plurality of vias.

9. The apparatus of claim 8 the second material comprising a low loss material with an average dielectric constant in the range of 1.3 to 2.5, inclusive.

10. An apparatus, comprising:
    a silicon building block doped with a single dopant;
    a plurality of vias penetrating the silicon building block;
    an integrated circuit die;
    a first plurality of solder balls electrically connecting the integrated circuit die to the plurality of vias;
    a printed circuit board electrically connected to the plurality of vias by a second plurality of solder balls, wherein power and signal paths utilized by the integrated circuit die pass through the plurality of vias; and
    an interposer substrate disposed between the silicon building block and the printed circuit board.

11. The apparatus of claim 10, wherein the silicon building block provides a common reference for signals that pass through the plurality of vias.

12. The apparatus of claim 10, wherein the plurality of vias comprises:
   a first set of vias; and
   a second set of vias.

13. The apparatus of claim 12, wherein the first set of vias comprises a first material and the second set of vias comprises a second material.

14. The apparatus of claim 13 wherein the first material has an average dielectric constant greater than or equal to 100 and the second material has an average dielectric constant in the range of 1.3 to 2.5.

15. The apparatus of claim 12 wherein the first set of vias are single-ended signal paths and the second set of vias are differential signal paths.

* * * * *

UNITED STATES PATENT AND TRADEMARK OFFICE
CERTIFICATE OF CORRECTION

PATENT NO. : 7,205,638 B2 Page 1 of 1
APPLICATION NO. : 10/931497
DATED : April 17, 2007
INVENTOR(S) : David G. Figueroa et al.

It is certified that error appears in the above-identified patent and that said Letters Patent is hereby corrected as shown below:

At column 6, line 6, please replace "vias arc" with
--vias are--

Signed and Sealed this

Fourth Day of December, 2007

JON W. DUDAS
*Director of the United States Patent and Trademark Office*